United States Patent
Cox et al.

(10) Patent No.: US 6,894,474 B2
(45) Date of Patent: May 17, 2005

(54) NON-INTRUSIVE PLASMA PROBE

(75) Inventors: Michael S. Cox, Davenport, CA (US); Canfeng Lai, Fremont, CA (US); Qiwei Liang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 88 days.

(21) Appl. No.: 10/165,489

(22) Filed: Jun. 7, 2002

(65) Prior Publication Data
US 2003/0227283 A1 Dec. 11, 2003

(51) Int. Cl.[7] ............................................. G01N 27/00
(52) U.S. Cl. ...................... 324/71.1; 324/464; 73/30.04
(58) Field of Search ................................ 324/71.1, 459, 324/464, 465, 754; 73/30.01, 30.04, 31.05; 436/156

(56) References Cited

U.S. PATENT DOCUMENTS

| | | | |
|---|---|---|---|
| 3,833,851 A | 9/1974 | Jobes, Jr. et al. ....... 324/71 EB |
| 5,339,039 A | 8/1994 | Carlile et al. ................ 324/655 |
| 5,705,931 A * | 1/1998 | Klick .......................... 324/464 |
| 5,801,386 A | 9/1998 | Todorov et al. ............. 250/397 |
| 5,936,413 A | 8/1999 | Booth et al. ................. 324/678 |
| 6,034,781 A | 3/2000 | Sarfaty et al. .............. 356/436 |
| 6,184,623 B1 * | 2/2001 | Sugai et al. ............ 315/111.21 |
| 6,300,227 B1 * | 10/2001 | Liu et al. ..................... 438/513 |
| 6,356,097 B1 | 3/2002 | Loewenhardt et al. ...... 324/765 |

* cited by examiner

*Primary Examiner*—N. Le
*Assistant Examiner*—Timothy J. Dole
(74) *Attorney, Agent, or Firm*—Moser, Patterson & Sheridan

(57) ABSTRACT

A probe for measuring plasma properties in a processing chamber, comprises a conductive rod having a front portion and a rear portion. The front portion of the conductive rod comprises a probe surface adapted to be coplanar with an interior wall of the chamber. The probe also includes an insulating sheath circumscribing the conductive rod.

42 Claims, 3 Drawing Sheets

NON-INTRUSIVE PLASMA PROBE

BACKGROUND OF THE DISCLOSURE

1. Field of the Invention

The present invention generally relates to plasma enhanced semiconductor wafer processing systems and, more particularly, to an apparatus for measuring plasma characteristics within a semiconductor wafer process chamber.

2. Description of the Related Art

Plasma processing techniques are widely used in processing thin films on workpieces such as semiconductor substrates or wafers. For example, in plasma enhanced chemical vapor deposition (PECVD), the plasma provides a convenient means to enhance the reactivity of gas molecules in order to deposit films at low temperatures. In etch processing, exciting gaseous species into a plasma state greatly enhances the rate at which material layers may be etched, thereby increasing process throughput.

It is desirable to determine various properties of the plasma within the processing chamber, such as plasma density, charged-particle concentrations, and energy distribution functions. Analysis of such properties enables one to better control for example, the etch rate or deposition rate within the chamber.

An example of a conventional probe for monitoring plasma properties, also called a "Langmuir probe," is shown in FIG. 1. A plasma enhanced, semiconductor wafer processing system 100 includes a plasma chamber 102 having chamber walls 112. The chamber 102 includes a pedestal 104 and an electrostatic chuck 105, for supporting a substrate 106, a gas inlet 108 for introducing process gases, an electrode 109 for energizing a plasma 128 with an energy source 110 having a frequency, in the range of, for example, between about 400 kilohertz (kHz) and about 500 megahertz (MHz). The energy source 110 is typically a radio frequency (RF) source. A conventional probe 120 includes a conductive electrode 122 surrounded by an insulating sheath 124. The probe 102 is positioned such that a probe tip 126 extends into the plasma 128. A data analyzer 130 is coupled to the probe 102 to analyze various plasma properties.

Unfortunately, because the probe tip 126 extends into the plasma 128, the probe tip 126 is subject to degradation from exposure to the plasma. Material from the probe tip 126 may be ejected or sputtered into the chamber 102, and the material may then deposit, for example, on the chamber walls 112, on pedestal 104, or even on the substrate 106. While material from the probe tip 126 that impinges upon the chamber walls 112 may be removed through a chamber cleaning process, material that impinges upon the substrate 106 will likely damage the structures thereon, resulting in the substrate 106 being discarded.

One may reduce the likelihood of having material ejected from the probe tip 126 damage a substrate being processed by inserting the probe 120 into the chamber 102 only during selected time periods. For example, one may choose to insert the probe 120 into the chamber 102 when no substrate 106 or when a dummy substrate is being processed. However, this approach fails to address the need for in-situ or "real time" information concerning the properties of the plasma as a substrate 106 is processed.

Acquiring in-situ information about the plasma is highly desirable because such information may reveal, for instance, when a plasma perturbation may have taken place within the chamber 102. A plasma perturbation may, for example, result in deleterious effects to the substrates being processed in the chamber 102 during or after the perturbation. Therefore, knowledge of the specific timing of a plasma perturbation could, in turn, aid in diagnosing which substrates 106 and how many substrates 106 may have been adversely affected. Specific causes of the perturbation, such as a damaged electrode, incorrect gas flow, arcing between the electrostatic chuck and the substrate, among other causes may also be diagnosed through in-situ monitoring of plasma properties.

Therefore, a need exists for a non-intrusive plasma probe that is capable of in-situ monitoring of plasma properties.

SUMMARY OF THE INVENTION

The invention is a non-intrusive probe for measuring plasma properties in a processing chamber. The probe comprises a conductive rod having a front portion and a rear portion. The front portion of the conductive rod comprises a probe surface adapted to be coplanar with an interior wall of the chamber. The probe includes a sheath that insulates the rod from the chamber wall. The sheath circumscribes the conductive rod. The sheath may comprise a front sheath circumscribing the front portion of the conductive rod and a rear sheath circumscribing the rear portion of the conductive rod. The front sheath may comprise a rim that extends beyond the probe surface. The front portion of the conductive rod has a probe surface that may have a rounded edge.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
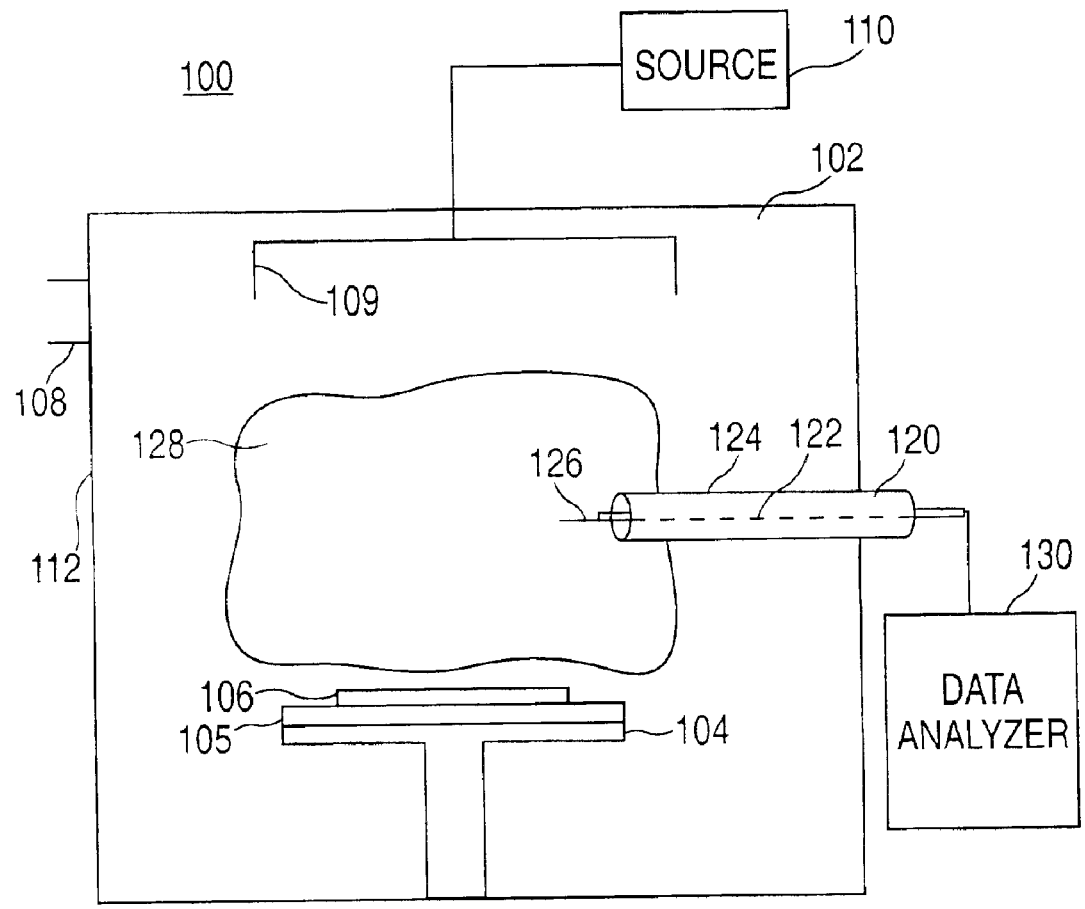
FIG. 1 is a schematic cross-sectional view of a plasma processing system including a prior art plasma probe.
Figure 2:
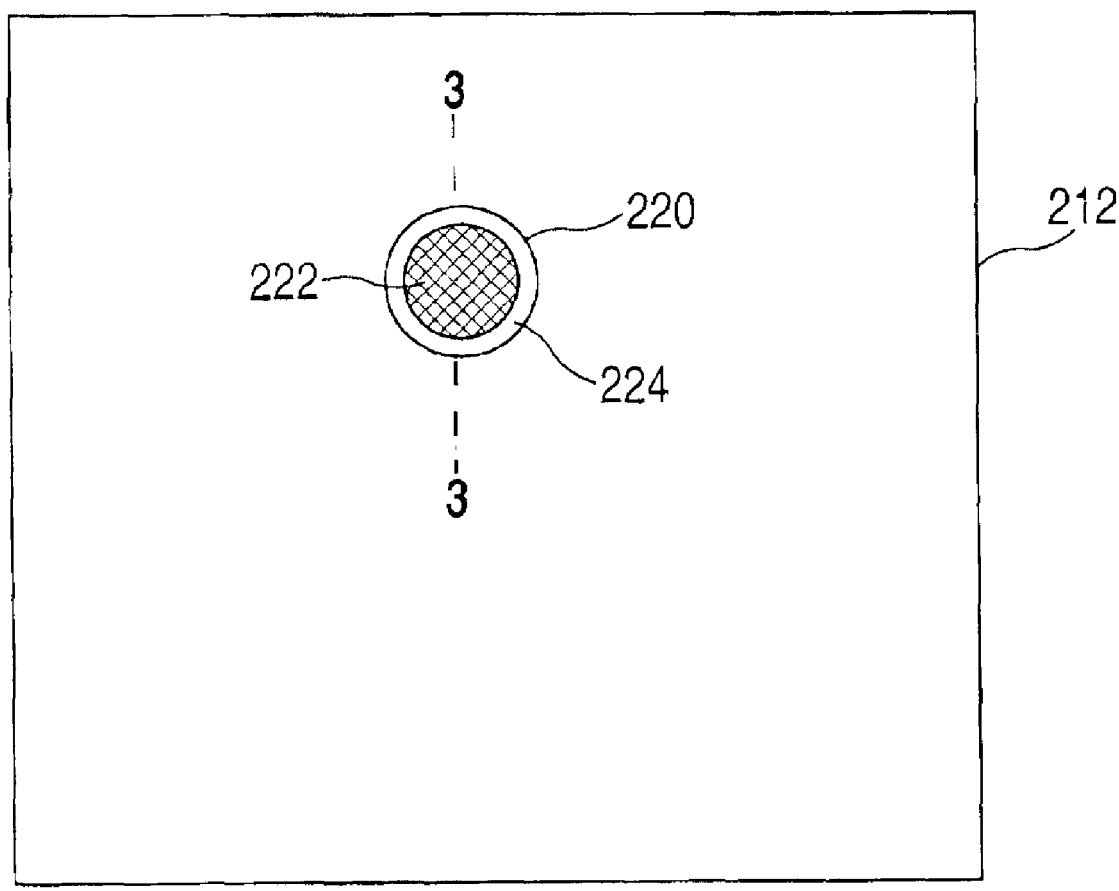
FIG. 2 is a front plan view of an embodiment of the plasma probe of the present invention.
Figure 3:
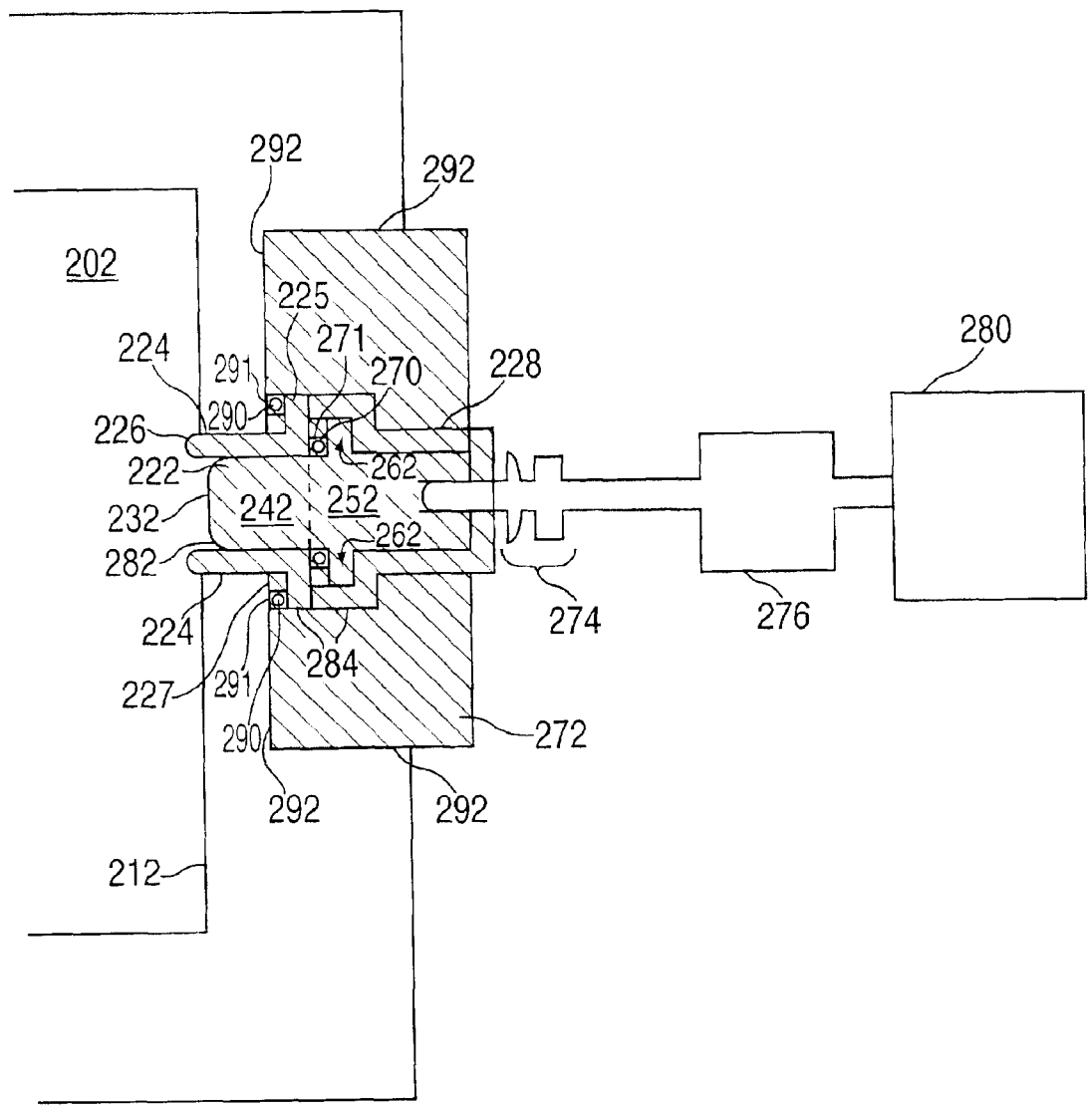
FIG. 3 is a cross-sectional view of the plasma probe of FIG. 2 taken along line 3—3 of FIG. 2.

FIG. 2 depicts a front plan view of one embodiment of an inventive plasma probe 220 inserted into a wall 212 of a plasma processing chamber 202. The chamber 202 is similar to chamber 102 of FIG. 1. FIG. 3 depicts a cross-sectional view of the plasma probe 220, the cross-section being taken through line 3—3 of FIG. 2. The plasma probe 220 includes a conductive rod 222 having a front portion 242 and a rear portion 252. The front portion 242 of the conductive rod 222 has a probe surface 232 that is positioned so as to be substantially coplanar with the wall 212 of the chamber 202. The probe surface 232 may have a rounded edge 282 in order to prevent high levels of charge that would otherwise accumulate at sharp corners on the probe surface 232 that could lead to arcing and non-uniformities in plasma properties near the probe 220.

The composition of the conductive rod 222 is variable and may depend upon the composition of the wall 212 of the plasma chamber 202. The composition of the rod 222 is preferably similar to the composition of the wall 212 (e.g. aluminum) in order to prevent the sputtering of the rod 222 into the chamber 202. The diameter of the conductive rod 222 is variable and may be selected based upon the plasma density typically encountered within the chamber 202, i.e., a larger diameter may be necessary for low plasma density environments.

The conductive rod 222 is circumscribed by and generally in contact with a sheath 284. In one embodiment, the front portion 242 of the conductive rod 222 is circumscribed by a front sheath 224 and the rear portion 252 of the conductive rod 222 is circumscribed by a rear sheath 228. The front portion 242 of the conductive rod 220 may be circumscribed by and generally in contact with the front sheath 224. The front sheath 224 electrically isolates the conductive rod 222 from the chamber wall 212. The front sheath 224 may include a rim 226 that extends beyond the probe surface 232 and into the chamber 202. The rim 226 partially shields the probe surface 232 from the plasma, thereby preventing material from the probe surface from being ejected into the chamber 202. The front sheath 224 comprises a dielectric material that is mechanically durable and able to withstand exposure to the plasma within chamber 202. For example, the front sheath 224 may comprise alumina, quartz, sapphire, among other dielectric materials. The front sheath 224 has a thickness and dielectric constant that are sufficiently large to prevent dissipation of charge from the conductive rod 222 to the chamber wall 212.

The rear portion 252 of the conductive rod 222 may be circumscribed by and generally in contact with a rear sheath 228. The rear sheath 228 generally is not exposed to the plasma within the chamber 202. The rear sheath 228 may comprise a dielectric material such as, for example, polytetrafluoroethylene (e.g. Teflon® available from E.I. du Pont de Nemours and Company of Wilmington, Del.). Other suitable materials might include polyimide materials or acetal resin materials (e.g. Kapton® or Delrin®, also both available from E.I. du Pont de Nemours and Company of Wilmington, Del.) The front sheath 224 and the rear sheath 228 may be a single continuous piece or unit. Alternatively, the front sheath 224 and the rear sheath 228 may be or two distinct and separate pieces.

A first seal 270, such as an o-ring, may be positioned within a first channel 271. The first channel 271 may be within a flanged area 262 of the conductive rod 222 such that the first seal 270 is positioned between the conductive rod 222 and the sheath 284. For example, the first seal 270 may be positioned between the flanged area 262 of the rear portion 252 of the conductive rod 222 and the front insulating sheath 224. The flanged area 262 of the conductive rod 222 is useful for providing pressure on the first seal 270, and the first seal 270 allows the probe 220 to communicate with one or more devices located outside the chamber 202, while helping maintain a pressure differential between the inside of the chamber 202 and the outside of the chamber 202. The first seal 270 may comprise a material that has a high level of durability with respect to plasma exposure, such as, for example, a perfluoroelastomer (e.g. Chemraz® available from Green, Tweed, & Co. of Kulpsville, Pa.).

An indentation 292 may be formed within the wall 212 to facilitate placement of the probe 220 into the wall 212. The indentation 292 in the wall 212 may also serve as location to position a cover 272 over the rear portion 252 of the conductive rod 222 and the rear sheath 228. The cover 272 may be constructed of a dielectric material such as a ceramic or polymeric material. The cover 272 may be fastened to the wall 212 by one or more fasteners (not shown) such as bolts, screws and the like. The cover 272 may also provide pressure to a second seal 290 that may be positioned within a second channel 291. The second channel 291 may be within the wall 212 of the chamber 202. For example, the second seal 290 may be positioned between a flanged portion 225 of the front sheath 224 and a surface 227 revealed by the indentation 292 in the wall 212 (i.e., an exterior wall). The pressure provided by the cover 272 enhances the ability of seal 290 to maintain a vacuum inside the chamber 202.

The probe 220 is connected to a monitoring circuit 276 and to one or more monitoring devices 280, such as oscilloscope, chart recorders, signal analyzers and the like via a connector 274. The connector 274 may be a standard BNC or SMA adapter that is soldered to the rear portion 252.

The probe 220 is positioned such that the probe surface 232 faces the chamber 202 and the probe surface 232 is substantially coplanar with the wall 212 of the chamber 202. A process sequence, such as, for example, a deposition process sequence or an etch process sequence is initiated in the chamber 202. Once a plasma is ignited within the chamber 202, ions impact the probe 220 and cause charge to accumulate on the conductive rod 222. This charge is communicated through the conductive rod 222 to the monitoring circuit 276 and to the monitoring device 280. The monitoring device 280 allows one to determine various plasma characteristics such as plasma density, charged-particle concentrations, energy distribution functions, and the like.

Because the probe 220 is non-intrusive and is not prone to contaminating the chamber 202, the probe 220 can monitor plasma properties within the chamber 202 in-situ, i.e., simultaneous with substrate processing. Furthermore, because the probe 220 has the probe surface 232 that is coplanar with the wall 212 of the chamber 202, the probe 202 is charged by the plasma to a level representative of the charging experienced by surfaces within the chamber 202, such as the wall 212. By sensing the properties of the plasma over a period of time, the probe 220 enables the detection of various plasma events and perturbations such as a damaged electrode 108, arcing between the electrostatic chuck 105 and the substrate 106, gas purges, bias match failure, among other events that result in changes in plasma properties. Thus, using the inventive probe described herein, one is able to determine which substrates processed within chamber 202 had been subjected to various plasma events and perturbations as well as the nature of those perturbations.

While the foregoing is directed to the preferred embodiment of the present invention, other and further embodiments of the invention may be devised without departing from the basic scope thereof, and the scope thereof is determined by the claims that follow.

What is claimed is:

1. A probe for measuring plasma properties in a processing chamber, comprising:
   a conductive rod comprising a front portion and a rear portion, wherein the front portion comprises a probe surface adapted to be coplanar with an interior wall of the chamber;
   an insulating sheath circumscribing the conductive rod, and
   a first seal positioned between the sheath and the conductive rod, wherein the rear portion of the conductive rod comprises a flanged area for biasing the first seal.

2. The probe of claim 1 wherein the insulating sheath has a front sheath and a rear sheath, the front portion of the conductive rod is circumscribed by the front sheath and the rear portion of the conductive rod is circumscribed by the rear sheath.

3. The probe of claim 2 wherein the front sheath comprises a ceramic material.

4. The probe of claim 3 wherein the ceramic material is selected from the group consisting of alumina, quartz, sapphire and combinations thereof.

5. The probe of claim 2 wherein the rear sheath comprises a polymeric material.

6. The probe of claim 5 wherein the polymeric material is selected from the group consisting of polytetrafluoroethylene, polyimide, acetal resin, and combinations thereof.

7. The probe of claim 1 further comprising a second seal positioned between the insulating sheath and an exterior wall of the chamber.

8. The probe of claim 1 wherein the probe surface has a rounded edge.

9. The probe of claim 1 wherein the insulating sheath comprises a rim that extends beyond the probe surface.

10. The probe of claim 1 wherein the insulating sheath comprises a material that is compatible with an environment within the chamber.

11. The probe of claim 1 wherein the insulating sheath comprises a ceramic material.

12. The probe of claim 11 wherein the ceramic material is selected from the group consisting of alumina, quartz, sapphire, and combinations thereof.

13. The probe of claim 1 wherein the insulating sheath comprises a polymeric material.

14. The probe of claim 13 wherein the polymeric material is selected from the group consisting of polytetrafluoroethylene, polyimide, acetal resin, and combinations thereof.

15. A probe for measuring plasma properties in a processing chamber, comprising:
   a conductive rod including a front portion and a rear portion, wherein the front portion comprises a probe surface having a rounded edge, wherein the probe surface is adapted to be coplanar with an interior wall of the chamber, and wherein the rear portion is adapted to be connected to one or more monitoring devices;
   a front insulating sheath circumscribing and in contact with the front portion of the conductive rod, wherein the front sheath comprises a rim that extends beyond the probe surface into an interior of the chamber; and
   a rear insulating sheath circumscribing and in contact with the rear portion of the conductive rod.

16. The probe of claim 15 further comprising a first seal positioned between the front insulating sheath and the conductive rod.

17. The probe of claim 15 further comprising a second seal positioned between the front insulating sheath and an exterior wall of the chamber.

18. The probe of claim 15 wherein the rear portion of the conductive rod comprises a flanged area for biasing the first seal.

19. The probe of claim 15 wherein the front insulating sheath comprises a material that is compatible with an environment within the chamber.

20. The probe of claim 15 wherein the front insulating sheath comprises a ceramic material.

21. The probe of claim 20 wherein the ceramic material is selected from the group consisting of alumina, quartz, sapphire, and combinations thereof.

22. The probe of claim 15 wherein the rear insulating sheath comprises a polymeric material.

23. The probe of claim 22 wherein the polymeric material is selected from the group consisting of polytetrafluoroethylene, polyimide, acetal resin, and combinations thereof.

24. A probe for measuring plasma properties in a processing chamber, comprising:
   a conductive rod including a front portion and a rear portion, wherein the front portion comprises a probe surface having a rounded edge, wherein the probe surface is adapted to be coplanar with an interior wall of the chamber, wherein the rear portion comprises a flanged area, and wherein the rear portion is adapted to be connected to one or more monitoring devices;
   a front insulating sheath circumscribing and in contact with the front portion of the conductive rod, wherein the front sheath comprises a rim that extends beyond the probe surface into an interior portion of the chamber;
   a rear insulating sheath circumscribing and in contact with the rear portion of the conductive rod;
   a first seal positioned between the front sheath and the flanged area of the conductive rod; and
   a second seal positioned between the front sheath and an exterior wall of the chamber.

25. The probe of claim 24 wherein the front insulating sheath comprises a material that is compatible with an environment within the chamber.

26. The probe of claim 24 wherein the front insulating sheath comprises a ceramic material.

27. The probe of claim 26 wherein the ceramic material is selected from the group consisting of alumina, quartz, sapphire, and combinations thereof.

28. The probe of claim 24 wherein the rear insulating sheath comprises a polymeric material.

29. The probe of claim 28 wherein the polymeric material is selected from the group consisting of polytetrafluoroethylene, polyimide, acetal resin, and combinations thereof.

30. A probe for measuring plasma properties in a processing chamber, comprising:
   a conductive rod comprising a front portion and a rear portion, wherein the front portion comprises a probe surface adapted to be coplanar with an interior wall of the chamber;
   an insulating sheath circumscribing the conductive rod, wherein the insulating sheath comprises a rim that extends beyond the probe surface; and
   a first seal positioned between the sheath and the conductive rod.

31. The probe of claim 30, wherein he insulating sheath has a front sheath and a rear sheath, the front portion of the conductive rod is circumscribed by the front sheath and the rear portion of the conductive rod is circumscribed by the rear sheath.

32. The probe of claim 31, wherein the front sheath comprises a ceramic material.

33. The probe of claim 32, wherein the ceramic material is selected from the group consisting of alumina, quartz, sapphire and combinations thereof.

34. The probe of claim 31, wherein the rear sheath comprises a polymeric material.

35. The probe of claim 34, wherein the polymeric material is selected from the group consisting of polytetrafluoroethylene polyimide, acetal resin, and combinations thereof.

36. The probe of claim 30 further comprising a second seal positioned between the insulating sheath and an exterior wall of the chamber.

37. The probe of claim 30 wherein the probe surface has a rounded edge.

38. The probe of claim 30, wherein the insulating sheath comprises a material that is compatible with an environment within the chamber.

39. The probe of claim 30, wherein the insulating sheath comprises a ceramic material.

40. The probe of claim 39, wherein the ceramic material is selected from the group consisting of alumina quartz, sapphire, and combinations thereof.

41. The probe of claim 30, wherein the insulating sheath comprises a polymeric material.

42. The probe of claim 41, wherein the polymeric material is selected from the group consisting of polytetrafluoroethylene, polyimide, acetel resin, and combinations thereof.

* * * * *

UNITED STATES PATENT AND TRADEMARK OFFICE
CERTIFICATE OF CORRECTION

PATENT NO. : 6,894,474 B2
DATED : May 17, 2005
INVENTOR(S) : Cox et al.

It is certified that error appears in the above-identified patent and that said Letters Patent is hereby corrected as shown below:

Column 4,
Line 61, after "rod" delete "," and insert -- ; --.

Column 6,
Line 57, delete "he" and insert -- the --.

Column 7,
Lines 4-5, after "polytetrafluoroethylene" insert -- , --.

Column 8,
Line 4, after "alumina" insert -- , --.
Line 11, delete "acetel" and insert -- acetal --.

Signed and Sealed this

Twenty-fourth Day of January, 2006

JON W. DUDAS
*Director of the United States Patent and Trademark Office*